(12) United States Patent
Kusano et al.

(10) Patent No.: US 9,338,384 B2
(45) Date of Patent: May 10, 2016

(54) SOLID-STATE IMAGING APPARATUS INCLUDING ELECTRICALLY CONNECTED SUBSTRATES

(71) Applicant: OLYMPUS CORPORATION, Tokyo (JP)

(72) Inventors: Yosuke Kusano, Tokyo (JP); Susumu Yamazaki, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 152 days.

(21) Appl. No.: 14/099,628

(22) Filed: Dec. 6, 2013

(65) Prior Publication Data

US 2014/0191112 A1 Jul. 10, 2014

(30) Foreign Application Priority Data

Jan. 8, 2013 (JP) ................. 2013-001142

(51) Int. Cl.
| | |
|---|---|
| *H03K 17/78* | (2006.01) |
| *H01L 27/00* | (2006.01) |
| *H04N 5/378* | (2011.01) |
| *H01L 27/146* | (2006.01) |
| *H04N 5/376* | (2011.01) |
| *H03M 1/06* | (2006.01) |
| *H03M 1/12* | (2006.01) |
| *H03M 1/56* | (2006.01) |

(52) U.S. Cl.
CPC .............. *H04N 5/378* (2013.01); *H01L 27/146* (2013.01); *H03M 1/06* (2013.01); *H04N 5/3765* (2013.01); *H03M 1/123* (2013.01); *H03M 1/56* (2013.01)

(58) Field of Classification Search
USPC ......... 250/208.1, 214 R, 239, 214.1, 214 DC; 341/126, 137, 155–172; 348/294, 348/297–299, 302–304, 311; 257/290, 291, 257/292, 414, 431–466
See application file for complete search history.

(56) References Cited

U.S. PATENT DOCUMENTS

| | | | | |
|---|---|---|---|---|
| 2007/0279506 | A1* | 12/2007 | Sato ............................. | 348/302 |
| 2009/0040352 | A1* | 2/2009 | Kawaguchi ................... | 348/308 |

FOREIGN PATENT DOCUMENTS

| | | |
|---|---|---|
| JP | 2011-166197 A | 8/2011 |
| JP | 2011-166235 A | 8/2011 |

* cited by examiner

*Primary Examiner* — Pascal M Bui Pho
(74) *Attorney, Agent, or Firm* — Westman, Hattori, Daniels & Adrian, LLP

(57) ABSTRACT

A solid-state imaging apparatus includes a pixel unit which has a plurality of pixels disposed in a two-dimensional matrix shape, wherein each of the pixels that a photoelectrical conversion element which generates a photoelectrical conversion signal corresponding to an amount of incident light disposed on a first substrate, and which outputs a photoelectrical conversion signal generated by each of the pixels to each row as a pixel signal, and an analog-to-digital converter which is disposed on every one or more columns of the pixel unit and generates a digital signal by digitizing a phase state of a multi-phase clock including clock signals of a plurality of phases different from each other at predetermined fixed intervals according to the pixel signal. Each of first and second circuit configuration units whose circuit scales are determined according to the multi-phase clock is disposed on a different substrate of a first or second substrate.

6 Claims, 8 Drawing Sheets

SOLID-STATE IMAGING APPARATUS INCLUDING ELECTRICALLY CONNECTED SUBSTRATES

BACKGROUND OF THE INVENTION

1. Field of the Invention

The present invention relates to a solid-state imaging apparatus.

Priority is claimed on Japanese Patent Application No. 2013-001142, filed Jan. 8, 2013, the content of which is incorporated herein by reference.

2. Description of Related Art

Recently, complementary metal oxide semiconductor (CMOS) image sensors have received attention and been practically used as solid-state imaging apparatuses. While a charge coupled device (CCD) image sensor is manufactured through a dedicated manufacturing process, the CMOS image sensor can be manufactured using a general semiconductor manufacturing process. Because of this, the CMOS image sensor, for example, can implement multiple functions by embedding various functional circuits in a sensor as in a system on chip (SOC).

Recently, as a solid-state imaging apparatus mounted on a digital camera, a digital video camera, or an endoscope, the number of examples in which a solid-state imaging apparatus with a built-in analog-to-digital converter (hereinafter referred to as an "A/D conversion circuit") is used, for example, as in Japanese Unexamined Patent Application, First Publication No. 2011-166235 and Japanese Unexamined Patent Application, First Publication No. 2011-166197, has increased. In the A/D conversion circuit embedded in such a solid-state imaging apparatus, a ramp type A/D conversion circuit may be used. In the following description, the A/D conversion circuit is assumed to be the ramp type A/D conversion circuit.

FIG. 7 is a block diagram illustrating a schematic configuration of a solid-state imaging apparatus of the related art. The solid-state imaging apparatus 800 of the related art illustrated in FIG. 7 includes a vertical scanning circuit 801, a pixel array unit 802, an analog signal processing circuit 803, a reference signal generation circuit (hereinafter referred to as a "digital-to-analog converter (DAC)") 804, a clock generation circuit 805, a column A/D conversion circuit 806, a horizontal scanning circuit 807, and a control circuit 808.

In the solid-state imaging apparatus 800, the analog signal processing circuit 803 generates an analog signal Vin by canceling noise from a pixel signal Vp output from each pixel 81 within the pixel array unit 802. Then, respective A/D conversion circuits 809 provided in the column A/D conversion circuit 806 perform A/D conversion on respective analog signals Vin generated by the analog signal processing circuit 803 and sequentially output A/D conversion results as digital signals DOUT.

According to a control signal input from the control circuit 808, the vertical scanning circuit 801 selects each pixel 81 within the pixel array unit 802 in units of rows of the pixel array unit 802, and causes a pixel signal Vp generated by each pixel 81 of the selected row to be output to the analog signal processing circuit 803. In the following description, a period until the next row is selected after a certain row of the pixel array unit 802 is selected is referred to as a "horizontal period."

The pixel array unit 802 is a pixel array two-dimensionally disposed in a horizontal direction (a transverse direction in FIG. 7) and a vertical direction (a longitudinal direction in FIG. 7) of the solid-state imaging apparatus 800. Each of pixels 81 includes a photodiode, and generates a photoelectrical conversion signal (pixel signal) Vp corresponding to an amount of incident light within a fixed accumulation time. Then, the pixel array unit 802 outputs the pixel signal Vp generated by the selected pixel 81 to the analog signal processing circuit 803 according to selection from the vertical scanning circuit 801.

The analog signal processing circuit 803 amplifies the noise-canceled pixel signal Vp after canceling noise such as reset noise or 1/f noise from the pixel signal Vp input from the pixel array unit 802 according to a control signal input from the control circuit 808. Then, the analog signal processing circuit 803 outputs the amplified noise-canceled pixel signal Vp as the analog signal Vin to the column A/D conversion circuit 806.

According to the control signal input from the control circuit 808, the DAC 804 generates a ramp wave Vramp whose voltage value varies at a fixed ratio according to time in each horizontal period, and outputs the generated ramp wave Vramp to the column A/D conversion circuit 806.

The clock generation circuit 805 generates a plurality of clocks (hereinafter referred to as "multi-phase clocks") DU having different phases from each other at fixed intervals to be used when the column A/D conversion circuit 806 performs A/D conversion. Then, the clock generation circuit 805 outputs each of the generated multi-phase clocks DU to the column A/D conversion circuit 806.

The column A/D conversion circuit 806 includes a plurality of A/D conversion circuits 809 equal in number to columns of the pixel array unit 802, wherein the plurality of A/D conversion circuits 809 have the same configuration including a comparator 82 and a data processing circuit 900. Each of the A/D conversion circuits 809 provided in the columns of the pixel array unit 802 performs a process in which the comparator 82 compares a voltage value of the input analog signal Vin to a voltage value of the ramp wave Vramp (hereinafter simply referred to as a "comparison process") in a horizontal period. Then, the data processing circuit 900 digitizes (binarizes) a time from a timing of an initial value of the ramp wave Vramp to a timing at which the comparison process of the comparator 82 has been completed based on the multi-phase clock DU. Thereby, a digital signal DOUT corresponding to a magnitude of the analog signal Vin input to each A/D conversion circuit 809 is generated.

The horizontal scanning circuit 807 selects digital signals DOUT obtained after the respective A/D conversion circuit 809 provided inside the column A/D conversion circuit 806 has performed A/D conversion in units of columns of the pixel array unit 802, and sequentially outputs the digital signals DOUT of selected columns as outputs of the solid-state imaging apparatus 800.

Here, the data processing circuit 900 provided in the A/D conversion circuit 809 in the solid-state imaging apparatus 800 of the related art will be described. FIG. 8 is a block diagram illustrating a schematic configuration of the data processing circuit 900 within the A/D conversion circuit 809 provided in the solid-state imaging apparatus 800 of the related art. The data processing circuit 900 of the related art illustrated in FIG. 8 includes a latch unit 901 and a digital generation unit 902 (see Japanese Unexamined Patent Application, First Publication No. 2011-166235).

The data processing circuit 900 holds a phase state of a multi-phase clock in the latch unit 901 at a timing at which the comparator 82 has completed the comparison process, and the held phase state of the held multi-phase clock is digitized by the digital generation unit 902. Thereby, a binarized digital signal is generated and output. In the following description, a number shown in "[ ]: brackets" following a reference sign represents a bit of each signal. For example, a second bit signal is indicated by "[1]" and a sixteenth bit signal is indicated by "[15]."

The latch unit 901 is a circuit which latches (holds) a state of a clock signal of a phase of each of the multi-phase clocks DU, and includes repeaters 91 and latch circuits 92, wherein each of the number of repeaters 91 and the number of latch circuits 92 is the same as the number of multi-phase clocks DU. The case in which L repeaters 91 (RP[L−1:0]) and L latch circuits 92 (DF[L−1:0]) corresponding to respective phases of multi-phase clocks DU[L−1:0] having L phases (L is a positive integer) are provided in the latch unit 901 provided in the data processing circuit 900 illustrated in FIG. 8 is shown.

In the latch unit 901 illustrated in FIG. 8, "RP" is assigned as a reference sign of the repeater 91, "DF" is assigned as a reference sign of the latch circuit 92, and a number representing each phase corresponding to a bit in the multi-phase clock DU is shown in "[ ]: brackets" following the reference signs "RP" and "DF." Thereby, each of the repeater 91 and the latch circuit 92 indicates a phase of a corresponding multi-phase clock DU. For example, a second phase of the multi-phase clock DU is indicated by the multi-phase clock DU[1], the repeater 91 corresponding to the multi-phase clock DU[1] is indicated by the repeater RP[1], and the latch circuit 92 corresponding to the repeater RP[1] is indicated by the latch circuit DF[1].

Each repeater 91 is a buffer circuit which compensates and drives a voltage of the multi-phase clock DU of a corresponding phase, and the driven multi-phase clock DU is output to each corresponding latch circuit 92. In FIG. 8, in the solid-state imaging apparatus 800 of the related art illustrated in FIG. 7, multi-phase clocks DU[0], DU[1], . . . , DU[L−1] input from the clock generation circuit 805 disposed outside the data processing circuit 900 are driven by corresponding repeaters RP[0], RP[1], . . . , RP[L−1], respectively, and are output to corresponding latch circuits DF[0], DF[1], . . . , DF[L−1], respectively (see Japanese Unexamined Patent Application, First Publication No. 2011-166197).

Each latch circuit 92 latches (holds) a "High" or "Low" state of a clock signal of a phase of a corresponding multi-phase clock DU at an inversion timing (rising or falling timing) of a latch signal LAT representing that a voltage value of the analog signal Vin has matched a voltage value of the ramp wave Vramp, that is, that the comparator 82 has completed the comparison process, in the comparison process by the comparator 82.

Then, the latch unit 901 sequentially outputs output signals DO[L−1:0] representing states of clock signals of respective phases of the multi-phase clocks DU[L−1:0] latched in the respective latch circuits DF[L−1:0] to the digital generation unit 902 according to timings of read switch signals SW[L−1:0] corresponding to the respective latch circuits 92. In addition, the latch unit 901 outputs an output signal DO[L−1] representing the same frequency as the multi-phase clock DU[L−1] latched in the last-stage latch circuit DF[L−1] to the digital generation unit 902 as a count clock UPCLK to be used when the digital generation unit 902 generates the digital signal DOUT.

The digital generation unit 902 is a circuit which generates a digital signal DOUT obtained by binarizing a state of a phase of a multi-phase clock DU when the comparator 82 has completed the comparison process based on the output signals DO[L−1:0] sequentially output from the latch unit 901, and, for example, includes an encoder 93, a lower-order counter 94, a multiplexer 95, and a higher-order counter 96 as illustrated in FIG. 8.

The encoder 93 includes a general logic circuit, and generates a count clock BOCLK to be used by the lower-order counter 94 for a count operation to output the generated count clock BOCLK to the lower-order counter 94 based on output signals DO[L−1:0] input from the latch unit 901.

By counting the number of occurrences of the "High" state of the count clock BOCLK, the lower-order counter 94 generates a binarized lower-order side digital signal BOOUT. In addition, the lower-order counter 94 outputs a digital signal of a most significant bit within the lower-order side digital signal BOOUT as an output signal BOMSB to the multiplexer 95 connected to the higher-order counter 96.

The multiplexer 95 switches a signal to be output to the higher-order counter 96 to either the count clock UPCLK (the output signal DO[L−1]) output from the latch circuit DF[L−1] or the output signal BOMSB output from the lower-order counter 94.

The higher-order counter 96 counts the number of occurrences of the "High" state of either the count clock UPCLK or the output signal BOMSB input from the multiplexer 95. Thereby, a binarized higher-order side digital signal UPOUT is generated.

Then, the digital generation unit 902 outputs a digital signal, which is obtained by combining the higher-order side digital signal UPOUT generated by the higher-order counter 96 as the more significant bit and the lower-order side digital signal BOOUT generated by the lower-order counter 94 as the less significant bit, as the digital signal DOUT.

In this manner, in the solid-state imaging apparatus 800 of the related art, the column A/D conversion circuit 806 outputs the digital signal DOUT obtained by performing A/D conversion on the analog signal Vin corresponding to each pixel signal Vp generated by each pixel 81 of the pixel array unit 802.

SUMMARY OF THE INVENTION

According to a first aspect of the present invention, a solid-state imaging apparatus is provided in which a first substrate, a second substrate electrically connected with the first substrate by a connector, a pixel unit having pixels disposed in a two-dimensional matrix shape, each of the pixels including a photoelectrical conversion element which is disposed on the first substrate and is configured to generate a photoelectrical conversion signal according to an amount of incident light, the pixel unit being configured to output a photoelectrical conversion signal generated by each of the pixels from each row as a pixel signal, and analog-to-digital (A/D) converters, each of which is disposed on every one or more columns of the pixels provided in the pixel unit and is configured to generate a digital signal by digitizing a phase state of a multi-phase clock including clock signals of phases different from each other at predetermined fixed intervals corresponding to the pixel signal, wherein each of the A/D converters comprises first and second circuit sections whose circuit scales are determined according to the multi-phase clock, wherein the first circuit section is disposed on one of the first substrate and the second substrate, and wherein the second circuit section is disposed on the other one of the first substrate and the second substrate on which the first circuit section is not disposed.

In addition, according to a second aspect of the present invention, the solid-state imaging apparatus according to the first aspect includes; each of the A/D converters includes a comparison circuit configured to compare the input pixel signal to a reference signal which monotonically increases or decreases with the passage of time, and to output a comparison signal indicating that a relationship between the reference signal and the pixel signal satisfies a predetermined condition, a latch unit having latch circuits configured to hold a phase state of the clock signal of a corresponding phase of the multi-phase clock at a timing at which the comparison signal is output, and a repeater unit having buffer circuits configured to compensate and drive a voltage of the clock signal of the corresponding phase of the multi-phase clock and to output the driven clock signal to the corresponding latch circuit, wherein the first circuit section includes the latch unit, and the second circuit section includes the repeater unit.

In addition, according to a third aspect of the present invention, the solid-state imaging apparatus according to the first aspect includes; each of the A/D converters includes a comparison circuit configured to compare the input pixel signal to a reference signal that monotonically increases or decreases with the passage of time, and to output a comparison signal indicating that a relationship between the reference signal and the pixel signal satisfies a predetermined condition, a latch unit having latch circuits configured to hold a phase state of the clocks signal of a corresponding phase of the multi-phase clock at a timing at which the comparison signal is output, a signal driving circuit configured to drive an output signal of a predetermined latch circuit of the latch unit, a lower-order digital signal generation unit configured to generate a lower-order side digital signal by digitizing the phase state of the multi-phase clock based on an output signal of each latch circuit of the latch unit, and a higher-order digital signal generation unit configured to generate a digitized higher-order side digital signal based on a signal of a predetermined bit of an output signal of a predetermined latch circuit driven by the signal driving circuit or the lower-order digital signal generated by the lower-order digital generation unit, wherein the first circuit section includes the signal driving circuit, and the second circuit section includes the lower-order digital signal generation unit.

In addition, according to a fourth aspect of the present invention, the solid-state imaging apparatus according to the third aspect includes; the signal driving circuit includes a Schmitt trigger circuit, wherein the lower-order digital signal generation unit includes; an encoder configured to encode a phase state of the multi-phase clock based on an output signal of each latch circuit of the latch unit and a lower-order counter configured to count the number of occurrences of a predetermined state of an output signal of the encoder, wherein the higher-order digital signal generation unit includes a multiplexer configured to output one of an output signal of a predetermined latch circuit driven by the signal driving circuit and an output signal of a predetermined bit of the lower-order counter and a higher-order counter configured to count the number of occurrences of a predetermined state of an output signal of the multiplexer, and wherein the second circuit section includes at least one of the encoder and the lower-order counter as a circuit element.

In addition, according to a fifth aspect of the present invention, the solid-state imaging apparatus according to the second aspect further includes; a reference signal generation circuit disposed on the second substrate and configured to generate the reference signal and a clock generation circuit disposed on the second substrate and configured to generate the multi-phase clock at a timing at which the A/D converter starts A/D conversion.

In addition, according to a sixth aspect of the present invention, in the solid-state imaging apparatus according to the fifth aspect, the first circuit section is disposed on the first substrate, and the second circuit section is disposed on the second substrate.

DETAILED DESCRIPTION OF THE INVENTION

First Embodiment

Hereinafter, the first embodiment of the present invention will be described with reference to the drawings. The following description includes specific detailed contents as an example. However, those skilled in the art will understand that the detailed contents may be varied or modified and the variations and modifications of the contents are within the scope of the present invention. Accordingly, various exemplary embodiments of the present invention to be described hereinafter will be described without loss of generality of the present invention described in the claims and without limitation on the present invention.

Figure 1:
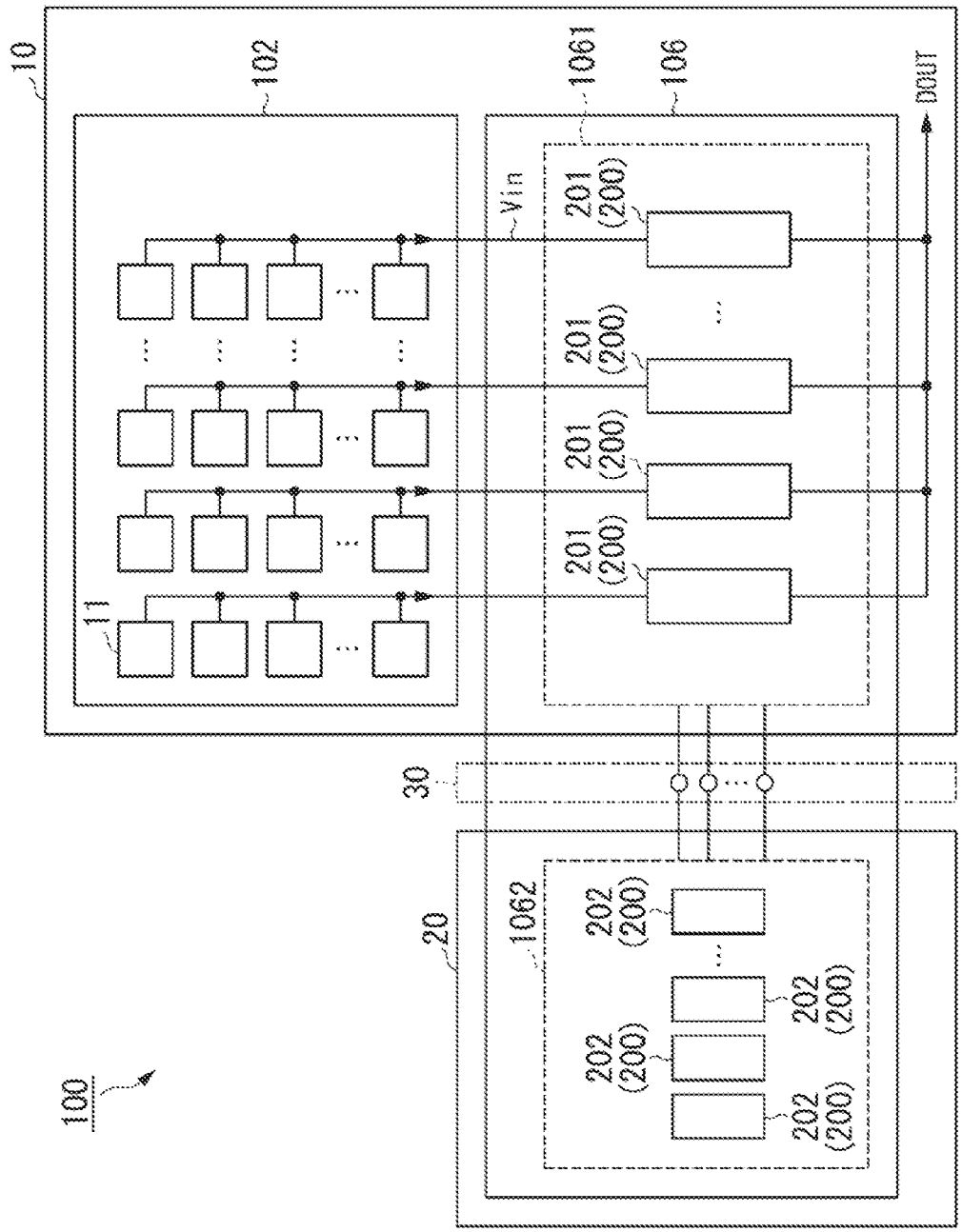
FIG. 1 is a block diagram illustrating a schematic configuration of a solid-state imaging apparatus in a first embodiment of the present invention.

FIG. 1 is a block diagram illustrating a schematic configuration of a solid-state imaging apparatus 100 in the first embodiment. The solid-state imaging apparatus 100 of the first embodiment illustrated in FIG. 1 includes a first substrate 10, a second substrate 20, and an inter-substrate connector 30. In the solid-state imaging apparatus 100, a pixel array unit 102 is disposed on a first substrate 10 and a column A/D conversion circuit 106 is divided and disposed on the first substrate 10 and the second substrate 20. The first substrate 10 and the second substrate 20 are separately manufactured, and the solid-state imaging apparatus 100 is formed in a state in which the first substrate 10 and the second substrate 20 are electrically connected through the inter-substrate connector 30 and bonded.

In the solid-state imaging apparatus 100, each A/D converter (hereinafter referred to as an "A/D conversion circuit") 200 provided within the column A/D conversion circuit 106 performs A/D conversion on analog signals Vin output from respective pixels 11 within the pixel array unit 102, and sequentially outputs A/D conversion results as digital signals DOUT.

The pixel array unit 102 is a pixel array in which a plurality of pixels 11 are two-dimensionally disposed in a horizontal direction (a transverse direction in FIG. 1) and a vertical direction (a longitudinal direction in FIG. 1) of the solid-state imaging apparatus 100. Each of the pixels 11 includes a photodiode (photoelectrical conversion element), and generates a photoelectrical conversion signal (pixel signal) corresponding to an amount of incident light within a fixed accumulation time. Then, the pixel array unit 102 outputs the photoelectrical conversion signal (pixel signal) generated by the pixel 11 as the analog signal Vin for each row to the column A/D conversion circuit 106.

The column A/D conversion circuit 106 includes a first A/D conversion unit 1061 disposed on the first substrate 10 and a second A/D conversion unit 1062 disposed on the second substrate 20. In addition, the first A/D conversion unit 1061 includes a plurality of first A/D conversion circuits 201 having the same configuration, wherein the number of first A/D conversion circuits 201 is the same as the number of columns of the pixel array unit 102, and a plurality of second A/D conversion circuits 202 having the same configuration, wherein the number of second A/D conversion circuits 202 is the same as the number of columns of the pixel array unit 102. Then, in the column A/D conversion circuit 106, the first A/D conversion circuit 201 and the second A/D conversion circuit 202 corresponding to the same certain column of the pixel array unit 102 constitute the A/D conversion circuit 200 corresponding to a certain column of the pixel array unit 102.

Each of the A/D conversion circuits 200 provided in the respective columns of the pixel array unit 102 counts a plurality of clocks (hereinafter referred to as "multi-phase clocks") DU having different phases from each other at fixed intervals according to a magnitude of an analog signal Vin. Thereby, the magnitude of the analog signal Vin is digitized (binarized).

Then, the column A/D conversion circuit 106 sequentially outputs respective results after the respective A/D conversion circuits 200 provided in columns of the pixel array unit 102 have counted multi-phase clocks for the respective columns as digital signals DOUT corresponding to magnitudes of analog signals Vin of the respective columns of the pixel array unit 102.

Figure 2:
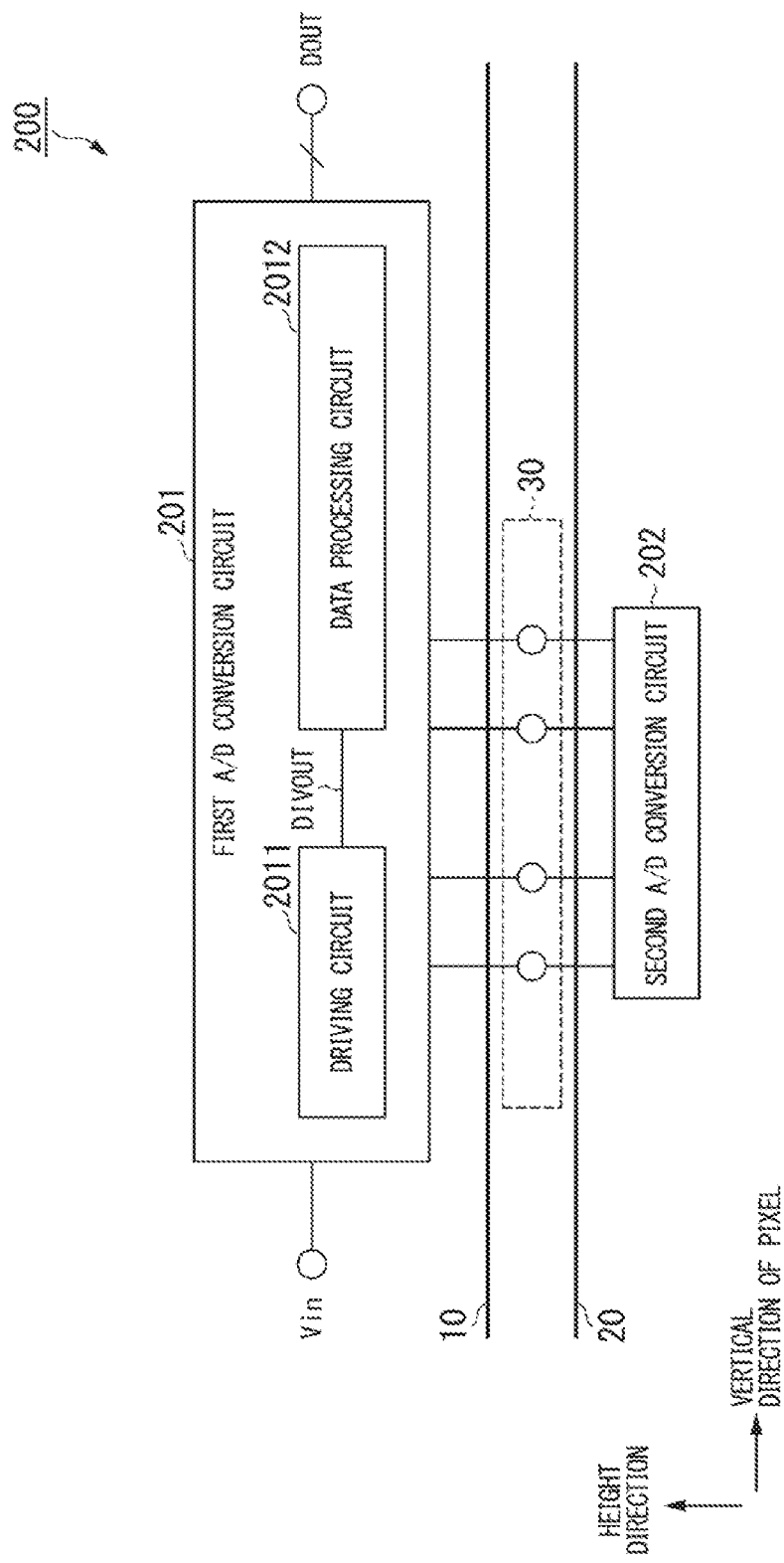
FIG. 2 is a block diagram illustrating a schematic configuration of an A/D conversion circuit provided in the solid-state imaging apparatus of the first embodiment.

Next, the configuration of the A/D conversion circuit 200 provided in the solid-state imaging apparatus 100 of the first embodiment will be described. FIG. 2 is a block diagram illustrating a schematic configuration of the A/D conversion circuit 200 provided in the solid-state imaging apparatus 100 of the first embodiment. The A/D conversion circuit 200 illustrated in FIG. 2 includes a first A/D conversion circuit 201 disposed on the first substrate 10 and a second A/D conversion circuit 202 disposed on the second substrate 20. In addition, the first A/D conversion circuit 201 includes a driving circuit 2011 and a data processing circuit 2012.

The driving circuit 2011 is a circuit that drives some circuits provided in the data processing circuit 2012 based on the input analog signal Vin, and outputs a drive signal DIVOUT for driving a target circuit to the data processing circuit 2012.

The data processing circuit 2012 and the second A/D conversion circuit 202 operate together, so that the multi-phase clock is counted according to a drive signal DIVOUT input from the driving circuit 2011, and the digital signal DOUT corresponding to a magnitude of the analog signal Vin is generated based on a counting result.

The second A/D conversion circuit 202 is a circuit having a circuit scale and a circuit area increasing according to the number of phases of multi-phase clocks input to the A/D conversion circuit 200. That is, the second A/D conversion circuit 202 is a circuit whose region is required to be extended in the vertical direction (the longitudinal direction in FIG. 1) of the pixel 11 disposed in the pixel array unit 102 according to the number of phases of multi-phase clocks.

Figure 7:
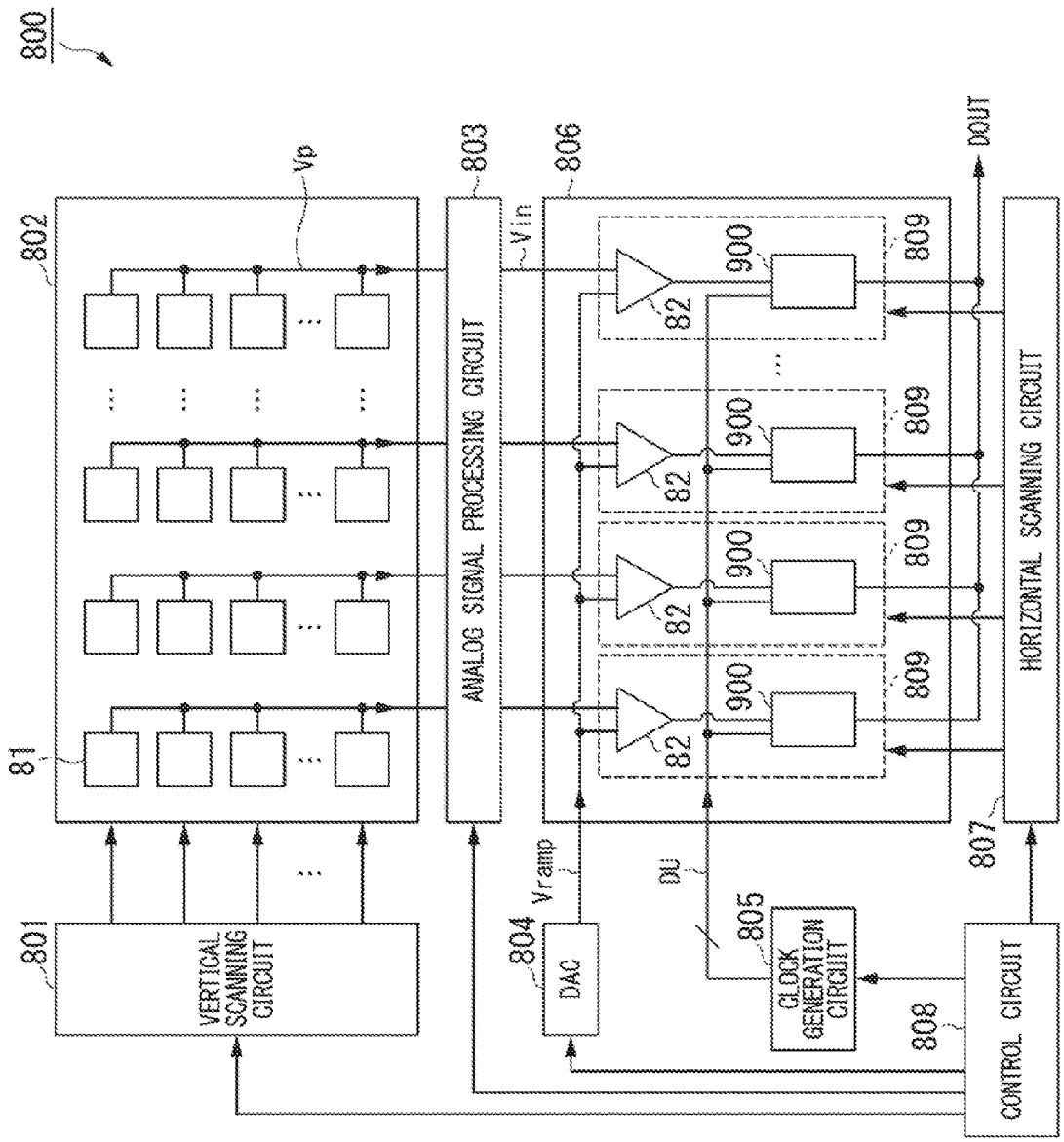
FIG. 7 is a block diagram illustrating a schematic configuration of a solid-state imaging apparatus of the related art.

Here, for example, each component of the A/D conversion circuit 200 may be disposed as in an A/D conversion circuit of the related art such as the A/D conversion circuit 809 provided in the solid-state imaging apparatus 800 of the related art illustrated in FIG. 7. In this case, within one substrate, the driving circuit 2011, the second A/D conversion circuit 202, and the data processing circuit 2012 are sequentially configured to be disposed in the vertical direction of the pixel 11 disposed in the pixel array unit 102. Because of this, for example, the drive signal DIVOUT corresponding to a latch signal LAT in the A/D conversion circuit 809 of the related art is input to the data processing circuit 2012 by passing through a region of a component provided in the second A/D conversion circuit 202. In the second A/D conversion circuit 202, as described above, because the circuit scale is increased according to the number of phases of multi-phase clocks input to the A/D conversion circuit, a wiring length of the drive signal DIVOUT is lengthened according to the number of phases of multi-phase clocks as in the A/D conversion circuit 809 of the related art, and a wiring load of a signal line of the drive signal DIVOUT is increased. From this, in the A/D conversion circuit of the related art, it is necessary to drive the drive signal DIVOUT by increasing the drive capability of the driving circuit 2011 and thus the circuit area or the current consumption of the driving circuit 2011 is increased.

However, as illustrated in FIG. 2, in the A/D conversion circuit 200 provided in the solid-state imaging apparatus 100, the second A/D conversion circuit 202 whose circuit scale is increased according to the number of phases of multi-phase clocks is disposed within the second substrate 20 separate from the first substrate 10 on which the first A/D conversion circuit 201 having the driving circuit 2011 and the data processing circuit 2012 is disposed, and connected to the first A/D conversion circuit 201 via the inter-substrate connector 30.

Thereby, in the solid-state imaging apparatus 100, the wiring length of the drive signal DIVOUT input from the driving circuit 2011 to the data processing circuit 2012 is not affected by the circuit scale of the second A/D conversion circuit 202 within each A/D conversion circuit 200, and it is possible to reduce the wiring load of the signal line of the drive signal DIVOUT by shortening the wiring length of the drive signal DIVOUT. Thereby, in the A/D conversion circuit 200 provided in the solid-state imaging apparatus 100, it is possible to reduce the drive capability of the driving circuit 2011 and reduce the circuit area or the current consumption of the driving circuit 2011.

As described above, in the solid-state imaging apparatus 100 of the first embodiment, the second A/D conversion circuit 202 whose circuit scale is increased according to the number of phases of multi-phase clocks within the components of the A/D conversion circuit 200 is disposed within the second substrate 20 separate from the first substrate 10 on which the first A/D conversion circuit 201 having the driving circuit 2011 and the data processing circuit 2012 is disposed. Thereby, in the solid-state imaging apparatus 100 of the first embodiment, it is possible to further shorten the wiring length of the drive signal DIVOUT output by the driving circuit 2011 provided in the A/D conversion circuit 200 to the data processing circuit 2012 than in the A/D conversion circuit of the related art and thus reduce the wiring load of the signal line of the drive signal DIVOUT. Thereby, in the solid-state imaging apparatus 100 of the first embodiment, it is possible to reduce the current consumption by reducing the drive capability of the driving circuit 2011 provided in the A/D conversion circuit 200 corresponding to each column of the pixel array unit 102 and reduce the power consumption of the solid-state imaging apparatus 100 itself.

In addition, in the solid-state imaging apparatus 100 of the first embodiment, the first A/D conversion circuit 201 and the second A/D conversion circuit 200 are divided and disposed on the first substrate 10 and the second substrate 20 as described above. Thereby, in each of the A/D conversion circuits 200 provided in the columns of the pixel array unit 102, it is possible to reduce the drive capability of the driving circuit 2011 and reduce the circuit area of the driving circuit 2011. Further, in the solid-state imaging apparatus 100 of the first embodiment, the second A/D conversion circuit 202 is disposed within the second substrate 20. Thereby, it is possible to reduce a region of the vertical direction (the longitudinal direction in FIG. 1) of the pixel array unit 102 forming the A/D conversion circuit 200. More specifically, the driving circuit 2011, the second A/D conversion circuit 202, and the data processing circuit 2012 can be sequentially formed by shortening the circuit length of the vertical direction of the A/D conversion circuit 200 by a circuit length of the vertical direction of the second A/D conversion circuit 202 as compared to the A/D conversion circuit of the related art disposed and formed in the vertical direction of the pixel array unit 102. Thereby, in the solid-state imaging apparatus 100 of the first embodiment, it is possible to reduce a chip area of the first substrate 10 on which the pixel array unit 102 is disposed, that is, a mounting area of the solid-state imaging apparatus 100, and implement the size reduction of the solid-state imaging apparatus 100 itself.

In the solid-state imaging apparatus 100 of the first embodiment described above, it is possible to obtain a greater effect with an increase in the number of phases of multi-phase clocks to cope with high resolution of the digital signal DOUT output by the solid-state imaging apparatus 100.

The case in which the pixel array unit 102 and the first A/D conversion unit 1061 within the column A/D conversion circuit 106 are disposed on the first substrate 10 and the second A/D conversion unit 1062 within the column A/D conversion circuit 106 is disposed on the second substrate 20 as illustrated in FIG. 1 in the solid-state imaging apparatus 100 of the first embodiment has been described. However, the component of the column A/D conversion circuit 106 disposed on each of the first substrate 10 and the second substrate 20 is not limited to the layout illustrated in FIG. 1, and can be disposed opposite to the layout illustrated in FIG. 1. That is, the pixel array unit 102 and the second A/D conversion unit 1062 within the column A/D conversion circuit 106 can be configured to be disposed on the first substrate 10, and the first A/D conversion unit 1061 within the column A/D conversion circuit 106 can be configured to be disposed on the second substrate 20.

Second Embodiment

Figure 3:
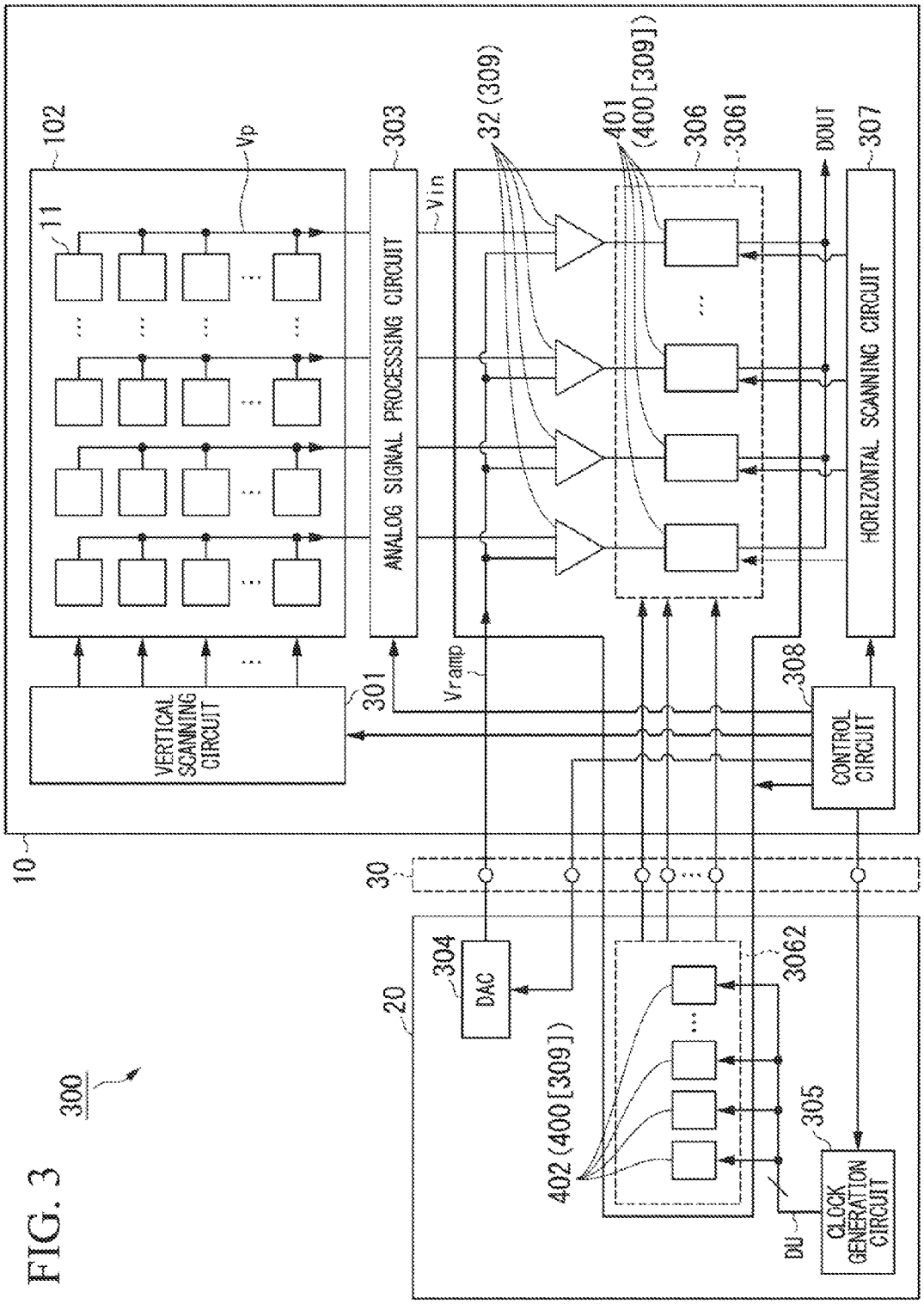
FIG. 3 is a block diagram illustrating a schematic configuration of a solid-state imaging apparatus in a second embodiment of the present invention.

Next, the second embodiment of the present invention will be described. FIG. 3 is a block diagram illustrating a schematic configuration of a solid-state imaging apparatus in the second embodiment. The solid-state imaging apparatus 300 of the second embodiment illustrated in FIG. 3 includes a first substrate 10, a second substrate 20, and an inter-substrate connector 30 as in the solid-state imaging apparatus 100 of the first embodiment illustrated in FIG. 1. In the solid-state imaging apparatus 300, a vertical scanning circuit 301, a pixel array unit 102, an analog signal processing circuit 303, a horizontal scanning circuit 307, and a control circuit 308 are disposed on the first substrate 10, and a reference signal generation circuit (hereinafter referred to as a "DAC") 304 and a clock generation circuit 305 are disposed on the second substrate 20. In addition, in the solid-state imaging apparatus 300, a column A/D conversion circuit 306 is divided and disposed on the first substrate 10 and the second substrate 20. The first substrate 10 and the second substrate 20 are separately manufactured, and the solid-state imaging apparatus 300 is formed in a state in which the first substrate 10 and the second substrate 20 are electrically connected through the inter-substrate connector 30 and bonded as in the solid-state imaging apparatus 100 of the first embodiment.

In the block diagram of the solid-state imaging apparatus 300 of the second embodiment illustrated in FIG. 3, the same components of the solid-state imaging apparatus 300 as those of the solid-state imaging apparatus 100 of the first embodiment are assigned the same reference signs.

In the solid-state imaging apparatus 300, the analog signal processing circuit 303 generates an analog signal Vin by canceling noise from a pixel signal Vp output from each pixel 11 within the pixel array unit 102. Then, respective A/D conversion circuits 309 provided in the column A/D conversion circuit 306 perform A/D conversion on analog signals Vin generated by the analog signal processing circuit 303 and sequentially output A/D conversion results as digital signals DOUT.

According to a control signal input from the control circuit 308, the vertical scanning circuit 301 selects the pixel 11 within the pixel array unit 102 in units of rows of the pixel array unit 102. The vertical scanning circuit 301 causes a pixel signal Vp generated by each pixel 11 of the selected row to be output to the analog signal processing circuit 303. In the following description, a period until the next row is selected after a certain row of the pixel array unit 102 is selected is referred to as a "horizontal period."

Because the pixel array unit 102 is the same as the pixel array unit 102 provided in the solid-state imaging apparatus 100 of the first embodiment, detailed description thereof is omitted. However, in the solid-state imaging apparatus 300, the photoelectrical conversion signal (pixel signal) generated by the selected pixel 11 according to selection from the vertical scanning circuit 301 is output as the pixel signal Vp to the analog signal processing circuit 303.

The analog signal processing circuit 303 amplifies the noise-canceled pixel signal Vp after canceling noise such as reset noise or 1/f noise from the pixel signal Vp input from the pixel array unit 102 according to a control signal input from the control circuit 308. Then, the analog signal processing circuit 303 outputs the amplified noise-canceled pixel signal Vp as an analog signal Vin to the column A/D conversion circuit 306.

According to the control signal input from the control circuit 308, the DAC 304 generates a ramp wave Vramp (reference signal) whose voltage value varies at a fixed ratio according to time in each horizontal period. The DAC 304 outputs the generated ramp wave Vramp to the column A/D conversion circuit 306. The ramp wave Vramp output by the DAC 304 is a signal whose voltage value is monotonically increased or decreased with the passage of time.

The clock generation circuit 305 generates a plurality of clocks (hereinafter referred to as "multi-phase clocks") DU having different phases from each other at fixed intervals to be used for A/D conversion when the column A/D conversion circuit 306 starts A/D conversion. Then, the clock generation circuit 305 outputs each of the generated multi-phase clocks DU to the column A/D conversion circuit 306.

The column A/D conversion circuit 306 includes a plurality of comparators (comparison circuits) 32 equal in number to the columns of the pixel array unit 102 and a first data processing group 3061 disposed on the first substrate 10 and a second data processing group 3062 disposed on the second substrate 20. In addition, the first data processing group 3061 includes a plurality of first data processing circuits 401 having the same configuration, wherein the number of first data processing circuits 401 is the same as the number of columns of the pixel array unit 102, and the second data processing group 3062 includes a plurality of second data processing circuits 402 having the same configuration, wherein the number of second data processing circuits 402 is the same as the number of columns of the pixel array unit 102. Then, within the column A/D conversion circuit 306, the data processing circuit 400 corresponding to a certain column of the pixel array unit 102 is configured in the first data processing circuit 401 and the second data processing circuit 402 corresponding to the same certain column of the pixel array unit 102, and the A/D conversion circuit 309 corresponding to a certain column of the pixel array unit 102 is configured in the comparator 32 corresponding to the same certain column of the pixel array unit 102 as that of the data processing circuit 400.

Each of the A/D conversion circuits 309 provided in the columns of the pixel array unit 102 performs a process in which the comparator 32 compares a voltage value of the input analog signal Vin to a voltage value of the ramp wave Vramp (hereinafter simply referred to as a "comparison process") in a horizontal period. Then, the data processing circuit 400 digitizes (binarizes) a time from a timing of an initial value of the ramp wave Vramp to a timing at which the comparison process of the comparator 32 has been completed based on the multi-phase clock DU. Thereby, a digital signal DOUT corresponding to a magnitude of the analog signal Vin input to each A/D conversion circuit 309 is generated.

The comparator 32 outputs a latch signal LAT (comparison signal) representing that the comparison process has been completed when a relationship between a voltage value of the input analog signal Vin and a voltage value of the ramp wave Vramp has satisfied a predetermined condition in the comparison process. The predetermined condition, for example, is a condition in which the voltage value of the analog signal Vin matches the voltage value of the ramp wave Vramp or the like.

The horizontal scanning circuit 307 selects digital signals DOUT obtained after the respective A/D conversion circuits 309 provided inside the column A/D conversion circuit 306 have performed A/D conversion in units of columns of the pixel array unit 102. The horizontal scanning circuit 307 sequentially outputs the digital signals DOUT of selected columns as outputs of the solid-state imaging apparatus 300.

Figure 4:
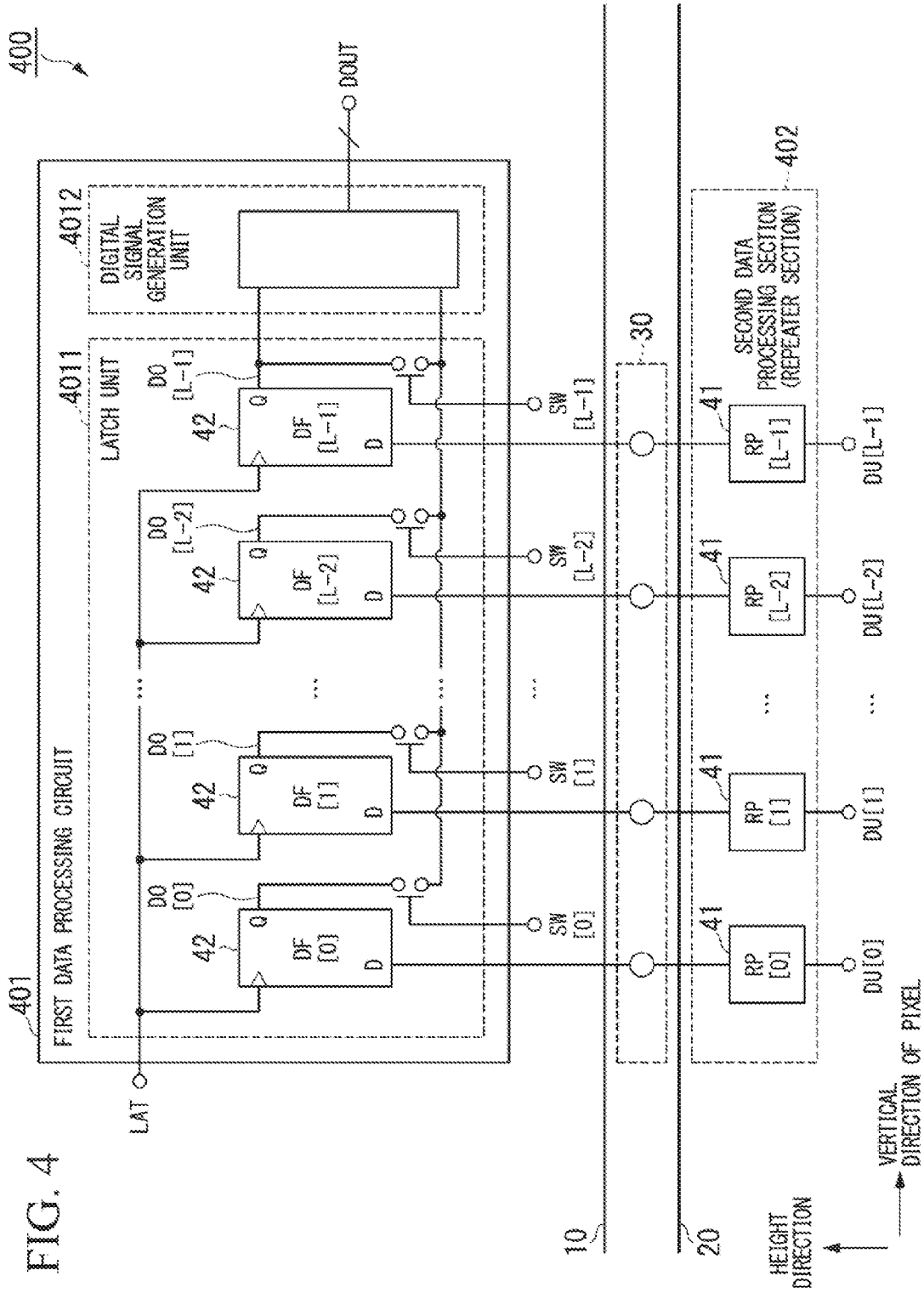
FIG. 4 is a block diagram illustrating a schematic configuration of a data processing circuit within an A/D conversion circuit provided in the solid-state imaging apparatus of the second embodiment.

Next, a configuration of the data processing circuit 400 within the A/D conversion circuit 309 provided in the solid-state imaging apparatus 300 of the second embodiment will be described. FIG. 4 is a block diagram illustrating a schematic configuration of the data processing circuit 400 within the A/D conversion circuit 309 provided in the solid-state imaging apparatus 300 of the second embodiment. The data processing circuit 400 illustrated in FIG. 4 includes the first data processing circuit 401 disposed on the first substrate 10 and the second data processing circuit 402 disposed on the second substrate 20. In addition, the first data processing circuit 401 includes a latch unit 4011 and a digital generation unit 4012, and the latch unit 4011 includes a plurality of latch circuits 42. In addition, the second data processing circuit 402 includes only a repeater unit, and the repeater unit includes a plurality of repeaters 41. In the following description, the second data processing circuit 402 is also referred to as the repeater unit 402.

The data processing circuit 400 holds a phase state of a multi-phase clock at a timing at which the comparator 32 has completed the comparison process in the latch unit 4011 within the first data processing circuit 401, and the held phase state of the multi-phase clock is digitized by the digital generation unit 4012. Thereby, a binarized digital signal is generated and output. In the following description, a number shown in "[ ]: brackets" following a reference sign represents a bit of each signal. For example, a second bit signal is indicated by "[1]" and a sixteenth bit signal is indicated by "[15]."

The repeater unit 402 (the second data processing circuit 402) includes a plurality of repeaters 41, each of which is a buffer circuit for compensating and driving a voltage of a multi-phase clock DU of a corresponding phase. The number of repeaters 41 is the same as the number of phases L (L is a positive integer) of multi-phase clocks DU. The case in which L repeaters 41 (RP[L−1:0]) corresponding to respective phases of multi-phase clocks DU[L−1:0] having L phases are included in the repeater unit 402 illustrated in FIG. 4 is shown.

In the repeater unit 402 illustrated in FIG. 4, "RP" is assigned as a reference sign of the repeater 41, and a number representing each phase corresponding to a bit in the multi-phase clock DU is shown in "[ ]: brackets" following the reference sign "RP." Thereby, each repeater 41 indicates a phase of a corresponding multi-phase clock DU. For example, a second phase of the multi-phase clock DU is indicated by the multi-phase clock DU[1], and the repeater 41 corresponding to the multi-phase clock DU[1] is indicated as the repeater RP[1].

In the respective repeaters 41, corresponding repeaters RP[0], RP[1], RP[L−1] drive multi-phase clocks DU[0], DU[1], DU[L−1] input from the clock generation circuit 305 disposed outside the A/D conversion circuit 309 on the second substrate 20, respectively. Then, each repeater 41 outputs a multi-phase clock DU of one driven phase to one of the corresponding latch circuits 42 within the latch unit 4011 provided in the first data processing circuit 401 disposed on the first substrate 10 via the inter-substrate connector 30.

The latch unit 4011 includes a plurality of latch circuits 42, each of which is a circuit that latches (holds) a state of one of multi-phase clocks DU of corresponding phases. The number of latch circuits 42 is the same as the number of phases of the multi-phase clocks DU. The case in which L latch circuits 42 (DF[L−1:0]) corresponding to respective phases of multi-phase clocks DU[L−1:0] having L phases are provided in the latch unit 4011 illustrated in FIG. 4 is shown.

In the latch unit 4011 illustrated in FIG. 4, "DF" is assigned as a reference sign of the latch circuit 42, and a number representing a phase of each of the multi-phase clocks DU is shown in "[ ]: brackets" following the reference sign "DF" as in the repeater 41. Thereby, each latch circuit 42 indicates a phase of a corresponding multi-phase clock DU. For example, the latch circuit 42 corresponding to the multi-phase clock DU[1] is indicated as the latch circuit DF[1].

Each latch circuit 42 latches (holds) a "High" or "Low" state of a clock signal of each phase of a multi-phase clock DU at an inversion timing (rising or falling timing) of a latch signal LAT representing that a voltage value of the analog signal Vin has matched a voltage value of the ramp wave Vramp, that is, that the comparator 32 has completed the comparison process, in the comparison process by the comparator 32.

More specifically, each of the latch circuits DF[0], DF[1], , DF[L−1] latches the "High" or "Low" state of the multi-phase clocks DU[0], DU[1], , DU[L−1] input from the corresponding repeaters RP[0], RP[1], , RP[L−1] within the repeater unit 402 disposed on the second substrate 20 via the inter-substrate connector 30 at an inversion timing of the latch signal LAT.

Then, the latch unit 4011 sequentially outputs output signals DO[L−1:0] representing states of clock signals of respective phases of the multi-phase clocks DU[L−1:0] latched in the respective latch circuits DF[L−1:0] to the digital generation unit 4012 according to timings of read switch signals SW[L−1:0] corresponding to the respective latch circuits 42. In addition, the latch unit 4011 outputs an output signal DO[L−1] representing the same frequency as the multi-phase clock DU[L−1] latched in the last-stage latch circuit DF[L−1] to the digital generation unit 4012 as a count clock to be used when the digital generation unit 4012 generates the digital signal DOUT.

The digital generation unit 4012 generates a digital signal DOUT by binarizing a state of a phase of a multi-phase clock DU when the comparator 32 has completed the comparison process based on the output signals DO[L−1:0] sequentially output from the latch unit 4011. Because a configuration and operation of the digital generation unit 4012 are the same as those of the digital generation unit 902 within the data processing circuit 900 illustrated in FIG. 8, detailed description thereof is omitted.

Through such a configuration, in the solid-state imaging apparatus 300, the column A/D conversion circuit 306 outputs the digital signal DOUT obtained by performing A/D conversion on the analog signal Vin corresponding to each pixel signal Vp generated by each pixel 11 of the pixel array unit 102.

Then, in the solid-state imaging apparatus 300, components of the data processing circuit 400 of the A/D conversion circuit 309 are disposed as described above. More specifically, in the solid-state imaging apparatus 300, the latch unit 4011 and the repeater unit 402 (the second data processing circuit 402) of the data processing circuit 400 having a circuit scale and area increasing according to the number of phases L of the multi-phase clocks input to the A/D conversion circuit 309 are divided and disposed on the first substrate 10 and the second substrate 20, respectively, and connected through inter-substrate connector 30.

Figure 8:
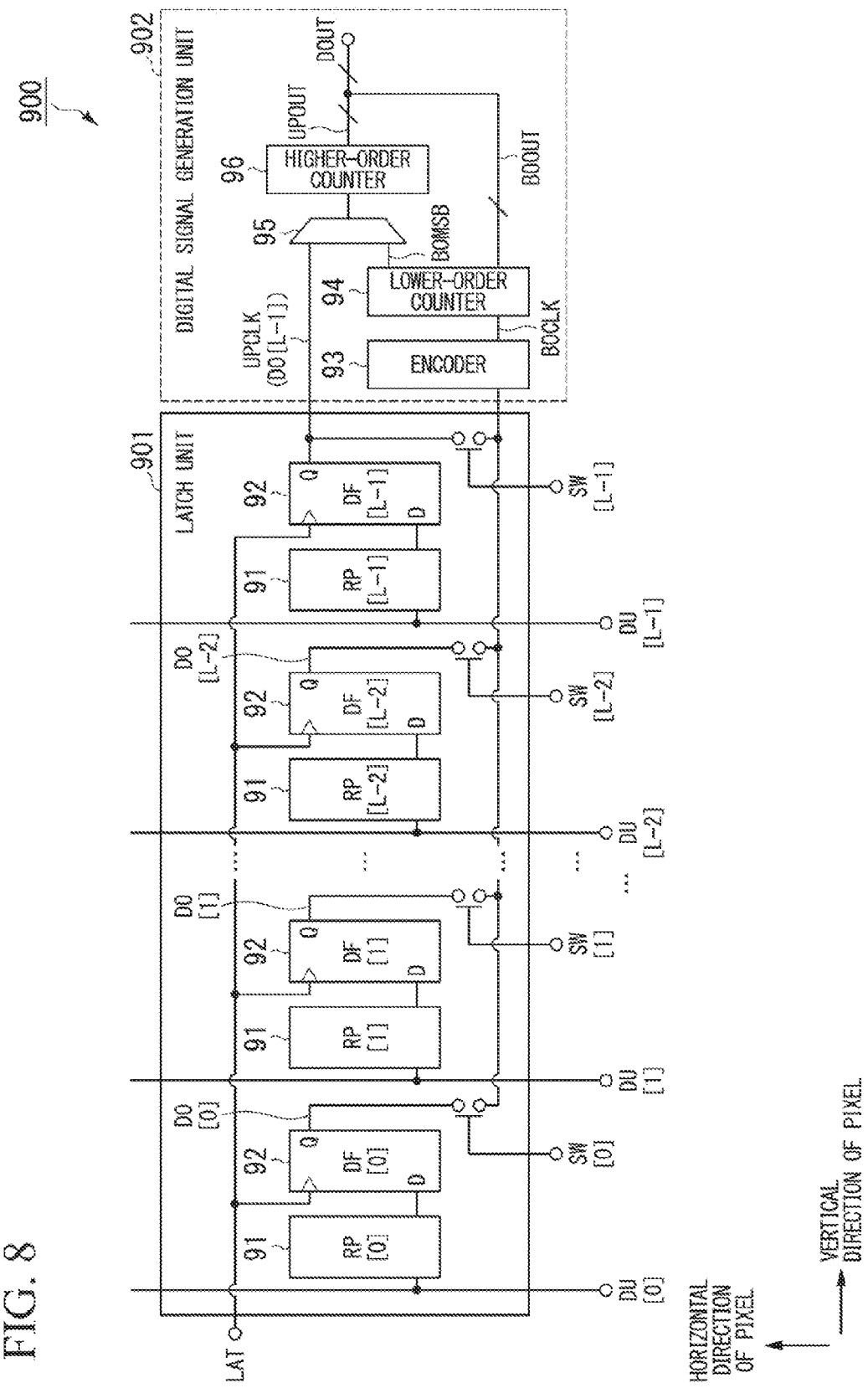
FIG. 8 is a block diagram illustrating a schematic configuration of a data processing circuit within an A/D conversion circuit provided in the solid-state imaging apparatus of the related art.

That is, in the data processing circuit 900 of the related art illustrated in FIG. 8, the repeater 91 and the latch circuit 92, which are the components of the latch unit 901, are alternately disposed in the vertical direction (the longitudinal direction in FIG. 7) within one substrate. Thereby, the circuit scale of the latch unit 901 is increased according to the number of phases L of the multi-phase clocks. On the other hand, in the solid-state imaging apparatus 300, the repeater 41 corresponding to the repeater 91, which is the component of the latch unit 901 whose circuit scale is increased (the number of circuits is increased) according to the number of phases L of the multi-phase clocks, and the latch circuit 42 corresponding to the latch circuit 92 are divided and disposed on the second substrate 20 and the first substrate 10, respectively.

Thereby, in the solid-state imaging apparatus 300, the wiring length of the latch signal LAT from the comparator 32 to each latch circuit 42 within the latch unit 4011 provided in the first data processing circuit 401 is not affected by the circuit scale of the repeater unit 402 within each A/D conversion circuit 309, and it is possible to reduce the wiring load of the signal line of the latch signal LAT by further shortening the wiring length of the latch signal LAT than in the A/D conversion circuit 809 of the related art.

Thereby, in the A/D conversion circuit 309 provided in the solid-state imaging apparatus 300, it is possible to reduce the drive capability of the comparator 32 and reduce the circuit area or the current consumption of the comparator 32.

As described above, in the solid-state imaging apparatus 300 of the second embodiment, the latch unit 4011 and the repeater unit 402 (the second data processing circuit 402) within the data processing circuit 400 having the circuit scale increasing according to the number of phases L of the multi-phase clocks within the components of the A/D conversion circuit 309 are divided and disposed on the first substrate 10 and the second substrate 20, respectively. Thereby, in the solid-state imaging apparatus 300 of the second embodiment, it is possible to further shorten the wiring length of the latch signal LAT output by the comparator 32 provided in the A/D conversion circuit 309 to each latch circuit 42 within the latch unit 4011 provided in the first data processing circuit 401 than in the A/D conversion circuit of the related art and thus reduce the wiring load of the signal line of the latch signal LAT. Thereby, in the solid-state imaging apparatus 300 of the second embodiment, it is possible to reduce the current consumption by reducing the drive capability of the comparator 32 provided in the A/D conversion circuit 309 corresponding to each column of the pixel array unit 102, and to reduce the power consumption of the solid-state imaging apparatus 300 itself as in the solid-state imaging apparatus 100 of the first embodiment.

In addition, in the solid-state imaging apparatus 300 of the second embodiment, the latch unit 4011 and the repeater unit 402 (the second data processing circuit 402) are divided and disposed on the first substrate 10 and the second substrate 20 as described above. Thereby, in each of the A/D conversion circuits 309 provided in respective columns of the pixel array unit 102, it is possible to reduce the drive capability of the comparator 32 and reduce the circuit area of the comparator 32. Further, in the solid-state imaging apparatus 300 of the second embodiment, the repeater unit 402 (the second data processing circuit 402) is disposed within the second substrate 20. Thereby, it is possible to reduce a region in a vertical direction (a longitudinal direction in FIG. 3) of the pixel array unit 102 forming the A/D conversion circuit 309. More specifically, the comparator 32, the repeater unit 402, the latch unit 4011, and the digital generation unit 4012 can be sequentially formed by shortening the circuit length of the vertical direction of the A/D conversion circuit 309 by a circuit length of the vertical direction of the repeater unit 402 as compared to the A/D conversion circuit of the related art disposed and formed in the vertical direction of the pixel array unit 102. Thereby, in the solid-state imaging apparatus 300 of the second embodiment, as in the solid-state imaging apparatus 100 of the first embodiment, it is also possible to reduce a chip area of the first substrate 10 on which the pixel array unit 102 is disposed, that is, a mounting area of the solid-state imaging apparatus 300, and implement the size reduction of the solid-state imaging apparatus 300 itself.

In the solid-state imaging apparatus 300 of the second embodiment described above, as in the solid-state imaging apparatus 100 of the first embodiment, it is possible to obtain a greater effect with an increase in the number of phases L of multi-phase clocks to cope with high resolution of the digital signal DOUT output by the solid-state imaging apparatus 300.

The case in which components involved in A/D conversion on the analog signal Vin are disposed as illustrated in FIG. 3 in the solid-state imaging apparatus 300 of the second embodiment has been described. More specifically, the case in which the first data processing group 3061 within the column A/D conversion circuit 306 is disposed on the first substrate 10 and the DAC 304, the clock generation circuit 305, and the second data processing group 3062 within the column A/D conversion circuit 306 are disposed on the second substrate 20 has been described.

However, components involved in A/D conversion on an analog signal Vin disposed on each of the first substrate 10 and the second substrate 20 are not limited to the layout illustrated in FIG. 3, and can be disposed on each of the first substrate 10 and the second substrate 20 in a combination of different components. For example, the clock generation circuit 305 and the second data processing group 3062 within the column A/D conversion circuit 306 can be configured to be disposed on the first substrate 10, and the DAC 304 and the first data processing group 3061 within the column A/D conversion circuit 306 can be configured to be disposed on the second substrate 20.

Third Embodiment

Figure 5:
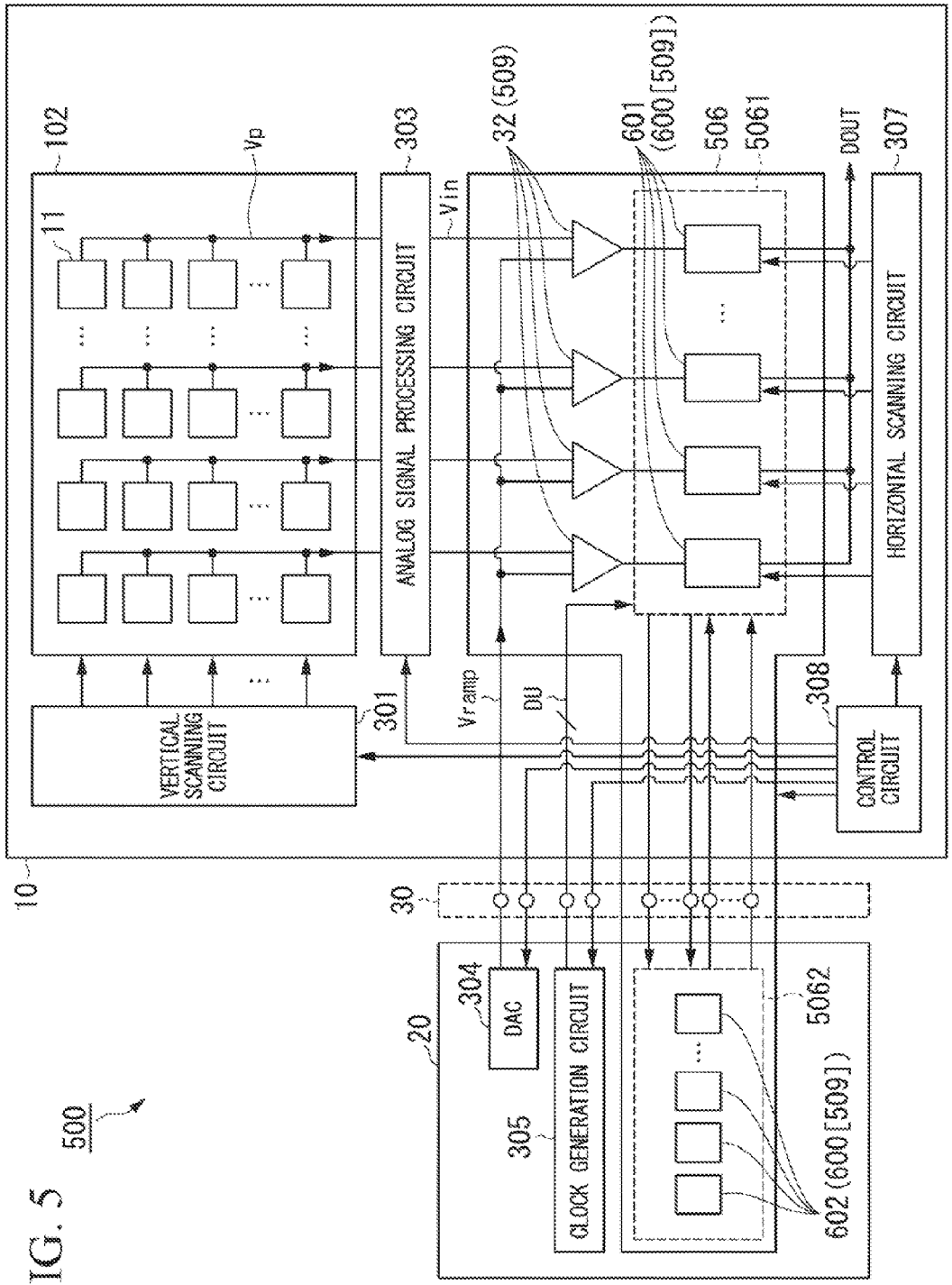
FIG. 5 is a block diagram illustrating a schematic configuration of a solid-state imaging apparatus in a third embodiment of the present invention.

Next, the third embodiment of the present invention will be described. FIG. 5 is a block diagram illustrating a schematic configuration of a solid-state imaging apparatus in the third embodiment. Like the solid-state imaging apparatus 100 of the first embodiment illustrated in FIG. 1 and the solid-state imaging apparatus 300 of the second embodiment illustrated in FIG. 3, the solid-state imaging apparatus 500 of the third embodiment illustrated in FIG. 5 includes a first substrate 10, a second substrate 20, and an inter-substrate connector 30. In the solid-state imaging apparatus 500, a vertical scanning circuit 301, a pixel array unit 102, an analog signal processing circuit 303, a horizontal scanning circuit 307, and a control circuit 308 are disposed on the first substrate 10, and a DAC 304 and a clock generation circuit 305 are disposed on the second substrate 20. In addition, in the solid-state imaging apparatus 500, a column A/D conversion circuit 506 is divided and disposed on the first substrate 10 and the second substrate 20. The first substrate 10 and the second substrate 20 are separately manufactured, and the solid-state imaging apparatus 500 is formed in a state in which the first substrate 10 and the second substrate 20 are electrically connected through the inter-substrate connector 30 and bonded as in the solid-state imaging apparatus 100 of the first embodiment and the solid-state imaging apparatus 300 of the second embodiment.

The solid-state imaging apparatus 500 is configured to include the column A/D conversion circuit 506 instead of the column A/D conversion circuit 306 provided in the solid-state imaging apparatus 300 of the second embodiment. More specifically, this is a configuration in which the first data processing group 3061 and the second data processing group 3062 within the column A/D conversion circuit 306 are changed to a first data processing group 5061 and a second data processing group 5062, respectively. In the block diagram of the solid-state imaging apparatus 500 of the third embodiment illustrated in FIG. 5, the same components of the solid-state imaging apparatus 500 as those of the solid-state imaging apparatus 100 of the first embodiment and the solid-state imaging apparatus 300 of the second embodiment are assigned the same reference signs. Accordingly, only components and operations changed from the solid-state imaging apparatus 100 of the first embodiment or the solid-state imaging apparatus 300 of the second embodiment will be described in the following description, and detailed description associated with the same components and operations as those of the solid-state imaging apparatus 100 of the first embodiment or the solid-state imaging apparatus 300 of the second embodiment is omitted.

Like the solid-state imaging apparatus 300, the solid-state imaging apparatus 500 generates an analog signal Vin by canceling noise from a pixel signal Vp output from each pixel 11 within the pixel array unit 102. Then, the respective A/D conversion circuits 509 provided in the column A/D conversion circuit 506 perform A/D conversion on analog signals Vin and sequentially output A/D conversion results as digital signals DOUT.

According to a control signal input from the control circuit 308, the analog signal processing circuit 303 outputs the analog signal Vin based on the pixel signal Vp input from the pixel array unit 102 amplified after noise cancellation to the column A/D conversion circuit 506.

According to a control signal input from the control circuit 308, the DAC 304 outputs a ramp wave Vramp in each horizontal period to the column A/D conversion circuit 506.

The clock generation circuit 305 outputs each of multi-phase clocks DU to be used when the column A/D conversion circuit 506 performs A/D conversion to the column A/D conversion circuit 506.

The column A/D conversion circuit 506 includes a plurality of comparators (comparison circuits) 32 equal in number to the columns of the pixel array unit 102 and the first data processing group 5061 disposed on the first substrate 10 and the second data processing group 5062 disposed on the second substrate 20. In addition, the first data processing group 5061 includes a plurality of first data processing circuits 601 having the same configuration, wherein the number of first data processing circuits 601 is the same as the number of columns of the pixel array unit 102, and the second data processing group 5062 includes a plurality of second data processing circuits 602 having the same configuration, wherein the number of second data processing circuits 602 is the same as the number of columns of the pixel array unit 102. Then, within the column A/D conversion circuit 506, the data processing circuit 600 corresponding to a certain column of the pixel array unit 102 is configured in the first data processing circuit 601 and the second data processing circuit 602 corresponding to the same certain column of the pixel array unit 102, and the A/D conversion circuit 509 corresponding to a certain column of the pixel array unit 102 is configured in the comparator 32 corresponding to the same certain column of the pixel array unit 102 as that of the data processing circuit 600.

Each of the A/D conversion circuits 509 provided in the columns of the pixel array unit 102 performs a process in which the comparator 32 compares a voltage value of the input analog signal Vin to a voltage value of the ramp wave Vramp in a horizontal period. Then, the data processing circuit 600 digitizes (binarizes) a time from a timing of an initial value of the ramp wave Vramp to a timing at which the comparison process of the comparator 32 has been completed based on the multi-phase clock DU. Thereby, a digital signal DOUT corresponding to a magnitude of the analog signal Vin input to each A/D conversion circuit 509 is generated.

The horizontal scanning circuit 307 selects digital signals DOUT after the respective A/D conversion circuits 509 provided in the column A/D conversion circuit 506 have performed A/D conversion in units of columns of the pixel array unit 102. The horizontal scanning circuit 307 sequentially outputs the digital signals DOUT of the selected columns as outputs of the solid-state imaging apparatus 500.

Figure 6:
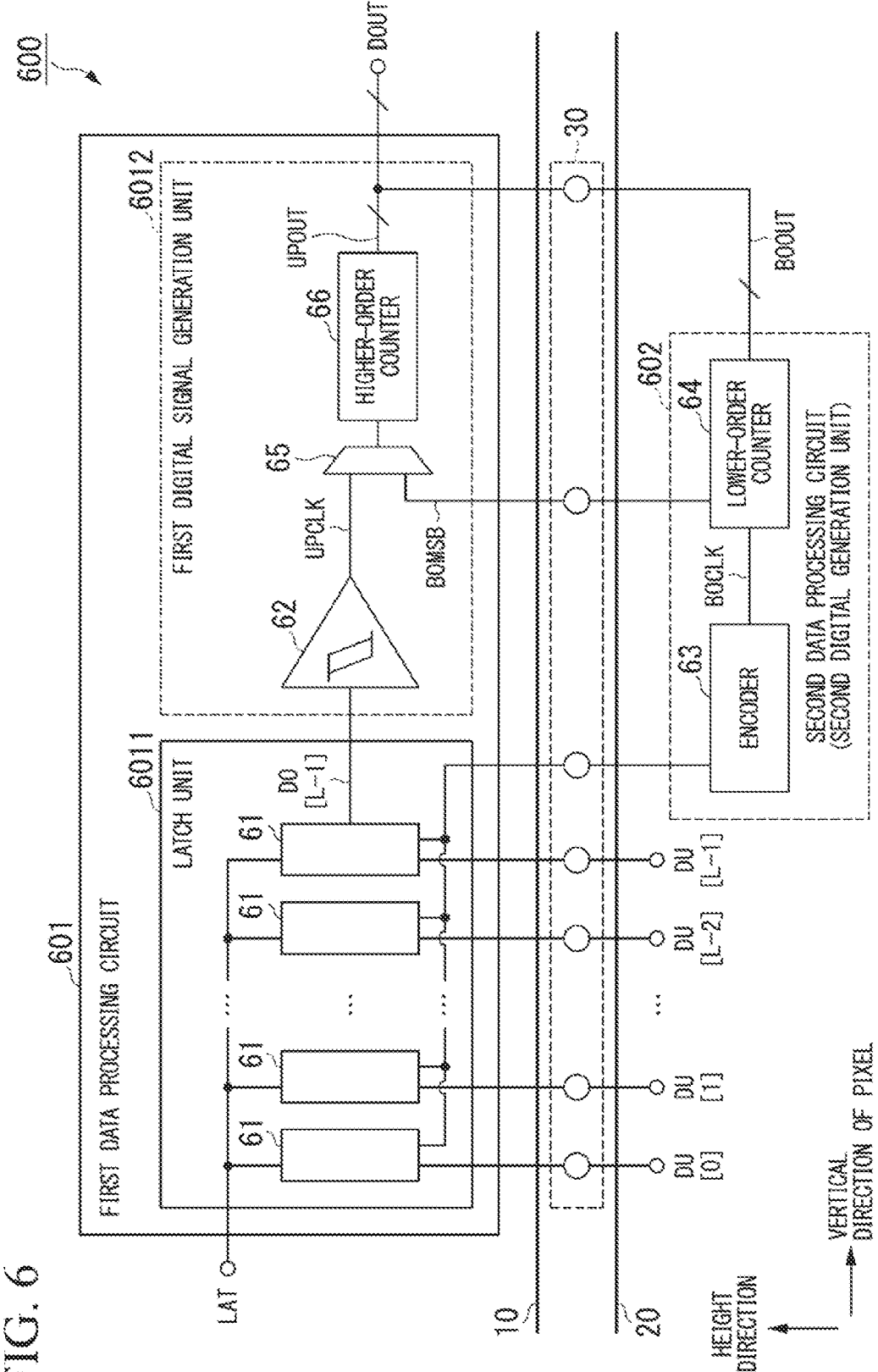
FIG. 6 is a block diagram illustrating a schematic configuration of a data processing circuit within an A/D conversion circuit provided in the solid-state imaging apparatus of the third embodiment.

Next, a configuration of the data processing circuit 600 within the A/D conversion circuit 509 provided in the solid-state imaging apparatus 500 of the third embodiment will be described. FIG. 6 is a block diagram illustrating a schematic configuration of the data processing circuit 600 within the A/D conversion circuit 509 provided in the solid-state imaging apparatus 500 of the third embodiment. The data processing circuit 600 illustrated in FIG. 6 includes the first data processing circuit 601 disposed on the first substrate 10 and the second data processing circuit 602 disposed on the second substrate 20. In addition, the first data processing circuit 601 includes a latch unit 6011 and a first digital generation unit 6012. In addition, the latch unit 6011 includes a plurality of latch units 61, and the first digital generation unit 6012 includes a Schmitt trigger 62, a multiplexer 65, and a higher-order counter 66. In addition, the second data processing circuit 602 includes an encoder 63 and a lower-order counter 64. In the following description, the second data processing circuit 602 is also referred to as the second digital generation unit 602.

The data processing circuit 600 holds a state of a phase of the multi-phase clock DU in the latch unit 6011 within the first data processing circuit 601 at a timing at which the comparator 32 has completed the comparison process, and digitizes the held state of the phase of the multi-phase clock in the first digital generation unit 6012 and the second digital generation unit 60 (the second data processing circuit 602). Thereby, a binarized digital signal is generated and output. In the following description, a number shown in "[ ]: brackets" following a reference sign represents a bit of each signal. For example, a second bit signal is indicated by "[1]" and a sixteenth bit signal is indicated by "[15]."

The latch unit 6011 includes a plurality of latch units 61 which are circuits for latching (holding) respective states of multi-phase clocks DU of corresponding phases, wherein the number of latch units 61 is the same as the number of phases L (L is a positive integer). The case in which L latch units 61 corresponding to respective phases of multi-phase clocks DU[L−1:0] having L phases are provided in the latch unit 6011 illustrated in FIG. 6 is shown. Each latch unit 61 includes a repeater which is a buffer circuit for compensating and driving a voltage of a multi-phase clock DU of a corresponding phase.

Each latch unit 61 latches (holds) the "High" or "Low" state of a clock signal of a phase of a corresponding multi-phase clock DU at an inversion timing (rising or falling timing) of a latch signal LAT input from the comparator 32.

Then, the latch unit 6011 sequentially outputs output signals DO[L−1:0] representing states of clock signals of respective phases of multi-phase clocks DU[L−1:0] latched in latch units 61 to the encoder 63 provided in the second digital generation unit 602 disposed on the second substrate 20 via the inter-substrate connector 30. In addition, the latch unit 6011 outputs an output signal DO[L−1] representing the same frequency as the multi-phase clock DU[L−1] latched in the last-stage latch unit 61[L−1] to the Schmitt trigger 62 provided in the first digital generation unit 6012 as a count clock to be used when the first digital generation unit 6012 generates the digital signal DOUT.

The encoder 63 includes a general logic circuit, and generates a count clock BOCLK to be used by the lower-order counter 64 for a count operation to output the generated count clock BOCLK to the lower-order counter 64 based on the output signals DO[L−1:0] input from the latch unit 6011 disposed on the first substrate 10.

The lower-order counter 64 generates a binarized lower-order side digital signal BOOUT by counting the number of occurrences of the "High" state of the count clock BOCLK, and outputs the generated digital signal BOOUT to the first digital generation unit 6012 provided in the first data processing circuit 601 disposed on the first substrate 10 via the inter-substrate connector 30. In addition, the lower-order counter 64 outputs a digital signal of a most significant bit within the lower-order side digital signal BOOUT as an output signal BOMSB to the multiplexer 65 connected to the higher-order counter 66 within the first digital generation unit 6012 provided in the first data processing circuit 601 disposed on the first substrate 10 via the inter-substrate connector 30.

The Schmitt trigger 62 suppresses fluctuation during state transition of a count clock input from the latch unit 6011. Thereby, this is a circuit which prevents an erroneous operation (miscount) in which the higher-order counter 66 counts the intermediate transition state of the count clock, and drives the count clock. The Schmitt trigger 62 outputs the count clock UPCLK obtained by suppressing the fluctuation of the count clock (output signal DO[L−1]) input from the last-stage latch unit 61[L−1] within the latch unit 6011 to the multiplexer 65 connected to the higher-order counter 66.

The multiplexer 65 switches a signal to be output to the higher-order counter 66 to either the count clock UPCLK output from the Schmitt trigger 62 or the output signal BOMSB output from the lower-order counter 64 within the second digital generation unit 602 disposed on the second substrate 20 via the inter-substrate connector 30.

The higher-order counter 66 counts the number of occurrences of the "High" state of either the counter clock UPCLK or the output signal BOMSB input from the multiplexer 65. Thereby, the binarized higher-order side digital signal UPOUT is generated.

Then, the first digital generation unit 6012 outputs a digital signal, which is obtained by combining the high-order side digital signal UPOUT generated by the higher-order counter 96 set as the more significant bit and the lower-order side digital signal BOOUT output from the lower-order counter 64 within the second digital generation unit 602 disposed on the second substrate 20 via the inter-substrate connector 30 set as a less significant bit, as the digital signal DOUT.

Through such a configuration, in the solid-state imaging apparatus 500, the column A/D conversion circuit 506 outputs the digital signal DOUT obtained by performing A/D conversion on the analog signal Vin corresponding to each pixel signal Vp generated by each pixel 11 of the pixel array unit 102.

The second digital generation unit 602 (the second data processing circuit 602) is a circuit which generates a lower-order side digital signal BOOUT obtained by binarizing the number of bits corresponding to the number of phases L of multi-phase clocks input to the A/D conversion circuit 509. That is, the second digital generation unit 602 (the second data processing circuit 602) has a circuit scale and a circuit area increasing according to the number of phases L of multi-phase clocks input to the A/D conversion circuit 509. Thereby, the second digital generation unit 602 (the second data processing circuit 602) is a circuit whose region is required to be extended in a vertical direction (a longitudinal direction in FIG. 5) of the pixel 11 disposed in the pixel array unit 102. In particular, in the lower-order counter 64, the circuit scale is significantly increased and the circuit area is increased because the number of bits of the lower-order side digital signal BOOUT generated according to the number of phases L of the multi-phase clocks is increased.

Here, for example, each component of the data processing circuits 600 within the A/D conversion circuit 509 may be disposed as in the A/D conversion circuit of the related art such as the A/D conversion circuit 809 provided in the solid-state imaging apparatus 800 of the related art illustrated in FIG. 7. In this case, within one substrate, the Schmitt trigger 62, the encoder 63, the lower-order counter 64, the multiplexer 65, and the higher-order counter 66 are configured to be sequentially disposed in the vertical direction (the longitudinal direction in FIG. 5) of the pixel 11 disposed in the pixel array unit 102. Because of this, the count clock UPCLK output by the Schmitt trigger 62 is input to the multiplexer 65 by passing through a region in which the encoder 63 and the lower-order counter 64 whose circuit scales are increased according to the number of phases L of the multi-phase clocks are disposed. Thereby, the wiring length of the count clock UPCLK is lengthened according to the number of phases L of the multi-phase clocks, and the wiring load of the signal line of the count clock UPCLK is increased. From this, when each component of the data processing circuit 600 is disposed as in the A/D conversion circuit of the related art, it is necessary to drive the count clock UPCLK by increasing the drive capability of the Schmitt trigger 62 and thus the circuit area or the current consumption of the Schmitt trigger 62 is increased.

However, as illustrated in FIG. 6, in the solid-state imaging apparatus 500, components of the data processing circuit 600 of the A/D conversion circuit 509 are disposed as described above. More specifically, in the solid-state imaging apparatus 500, the second digital generation unit 602 (the second data processing circuit 602) within the data processing circuit 600 whose circuit scale is increased according to the number of phases L of multi-phase clocks input to the A/D conversion circuit 509 is disposed within the second substrate 20 separate from the first substrate 10 on which the first data processing circuit 601 having the latch unit 6011 and the first digital generation unit 6012 is disposed, and is connected to the first data processing circuit 601 via the inter-substrate connector 30. That is, in the solid-state imaging apparatus 500, the encoder 63 and the lower-order counter 64 whose circuit scales are increased according to the number of phases L of multi-phase clocks are disposed within the second substrate 20 different from the first substrate 10 on which the Schmitt trigger 62 is disposed.

Thereby, in the solid-state imaging apparatus 500, the wiring length of the count clock UPCLK input from the Schmitt trigger 62 to the multiplexer 65 is not affected by the circuit scale of the second digital generation unit 602 in the data processing circuit 600 within each A/D conversion circuit 509, and it is possible to reduce the wiring load of the signal line of the count clock UPCLK by shortening the wiring length of the count clock UPCLK. Thereby, in the A/D conversion circuit 509 provided in the solid-state imaging apparatus 500, it is possible to reduce the drive capability of the Schmitt trigger 62 and reduce the circuit area or the current consumption of the Schmitt trigger 62.

As described above, in the solid-state imaging apparatus 500 of the third embodiment, among components of the A/D conversion circuit 509, the second digital generation unit 602 (the second data processing circuit 602) within the data processing circuit 600 having a circuit scale increasing according to the number of phases L of multi-phase clocks is disposed within the second substrate 20 separate from the first substrate 10 in which the first data processing circuit 601 having the latch unit 6011 and the first digital generation unit 6012 is disposed. Thereby, in the solid-state imaging apparatus 500 of the third embodiment, it is possible to further shorten the wiring length of the count clock UPCLK output by the Schmitt trigger 62 within the data processing circuit 600 provided in the A/D conversion circuit 509 to the multiplexer 65 than in the A/D conversion circuit of the related art and thus reduce the wiring load of the signal line of the count clock UPCLK. Thereby, in the solid-state imaging apparatus 500 of the third embodiment, it is possible to reduce the current consumption by reducing the drive capability of the Schmitt trigger 62 within the data processing circuit 600 provided in an A/D conversion circuit 509 corresponding to each column of the pixel array unit 102 and reduce the power consumption of the solid-state imaging apparatus 500 itself as in the solid-state imaging apparatus 100 of the first embodiment and the solid-state imaging apparatus 300 of the second embodiment.

In addition, in the solid-state imaging apparatus 500 of the third embodiment, the first digital generation unit 6012 and the second digital generation unit 602 (the second data processing circuit 602) are divided and disposed on the first substrate 10 and the second substrate 20 as described above. Thereby, in each of the A/D conversion circuits 509 provided in the columns of the pixel array unit 102, it is possible to reduce the drive capability of the Schmitt trigger 62 and reduce the circuit area of the Schmitt trigger 62. Further, in the solid-state imaging apparatus 500 of the third embodiment, the second digital generation unit 602 (the second data processing circuit 602) is disposed within the second substrate 20. Thereby, it is possible to reduce a region of the vertical direction (the longitudinal direction in FIG. 5) of the pixel array unit 102 forming the A/D conversion circuit 509. More specifically, the Schmitt trigger 62, the encoder 63, the lower-order counter 64, the multiplexer 65, and the higher-order counter 66 can be sequentially formed by shortening the circuit length of the vertical direction of the A/D conversion circuit 509 by a circuit length of the vertical direction of the encoder 63 and the lower-order counter 64 as compared to the A/D conversion circuit of the related art disposed and formed in the vertical direction of the pixel array unit 102. Thereby, even in the solid-state imaging apparatus 500 of the third embodiment, as in the solid-state imaging apparatus 100 of the first embodiment and the solid-state imaging apparatus 300 of the second embodiment, it is possible to reduce the chip area of the first substrate 10 on which the pixel array unit 102 is disposed, that is, the mounting area of the solid-state imaging apparatus 500, and implement the size reduction of the solid-state imaging apparatus 500 itself.

In the solid-state imaging apparatus 500 of the third embodiment described above, it is possible to obtain a greater effect with an increase in the number of phases L of multi-phase clocks to cope with high resolution of the digital signal DOUT output by the solid-state imaging apparatus 500 as in the solid-state imaging apparatus 100 of the first embodiment and the solid-state imaging apparatus 300 of the second embodiment.

The case in which components associated with A/D conversion of the analog signal Vin in the solid-state imaging apparatus 500 of the third embodiment are disposed as illustrated in FIG. 5 has been described. More specifically, the case in which the first data processing group 5061 within the column A/D conversion circuit 506 is disposed on the first substrate 10, and the DAC 304, the clock generation circuit 305, and the second data processing group 5062 within the column A/D conversion circuit 506 are disposed on the second substrate 20 has been described.

However, components involved in A/D conversion on an analog signal Vin disposed on each of the first substrate 10 and the second substrate 20 are limited to the layout illustrated in FIG. 5, and can be disposed on each of the first substrate 10 and the second substrate 20 in a combination of different components. For example, the second data processing group 5062 within the column A/D conversion circuit 506 is configured to be disposed on the first substrate 10, and the DAC 304, the clock generation circuit 305, and the first data processing group 5061 within the column A/D conversion circuit 506 can be configured to be disposed on the second substrate 20. In addition, for example, the DAC 304, the clock generation circuit 305, and the first data processing group 5061 within the column A/D conversion circuit 506 can be configured to be disposed on the first substrate 10 and the second data processing group 5062 within the column A/D conversion circuit 506 can be configured to be disposed on the second substrate 20.

In addition, the case in which the Schmitt trigger 62 is provided as a circuit which outputs the count clock UPCLK to be used when the higher-order counter 66 generates the binarized higher-order side digital signal UPOUT in the solid-state imaging apparatus 500 of the third embodiment has been described. However, the circuit that outputs the count clock UPCLK to be used when the higher-order counter 66 generates the binarized higher-order side digital signal UPOUT is not limited to the configuration of the third embodiment illustrated in FIG. 6. For example, in place of the Schmitt trigger 62, a configuration having a buffer circuit that drives the count clock input from the latch unit 6011 may be made. In addition, for example, a configuration in which the output signal DO[L−1] output by the last-stage latch unit 61[L−1] is directly set as the count clock UPCLK to be used when the higher-order counter 66 generates the binarized higher-order side digital signal UPOUT, that is, in which no Schmitt trigger 62 is provided, can be made.

In addition, the case in which the latch unit 6011 is one component in the solid-state imaging apparatus 500 of the third embodiment has been described. However, the configuration of the latch unit 6011 is not limited to that of the third embodiment illustrated in FIG. 6. For example, the latch unit 61 provided in the latch unit 6011 is a configuration having a repeater which is a buffer circuit for driving a multi-phase clock DU of a corresponding phase. That is, the latch unit 61 includes a latch circuit and a repeater. Because of this, even in the solid-state imaging apparatus 500 of the third embodiment, as in the solid-state imaging apparatus 300 of the second embodiment, a configuration in which each latch unit 61 provided in the latch unit 6011 is divided into a latch circuit and a repeater and disposed on each of the first substrate 10 and the second substrate 20 can be made.

In addition, the case in which the second data processing circuit 602 is configured to include the encoder 63 and the lower-order counter 64 in the solid-state imaging apparatus 500 of the third embodiment has been described. However, the configuration of the second data processing circuit 602 is not limited to that of the third embodiment illustrated in FIG. 6. For example, the second data processing circuit 602 can be configured to include only either the encoder 63 or the lower-order counter 64. In this case, either the encoder 63 or the lower-order counter 64 not provided in the second data processing circuit 602 may be configured to be provided in the first digital generation unit 6012.

As described above, according to a mode for carrying out the present invention, the solid-state imaging apparatus has a configuration in which a plurality of substrates are connected and components whose circuit scales are increased according to the number of phases of multi-phase clocks to be used when A/D conversion is performed within components of each A/D conversion circuit within the column A/D conversion circuit provided in the solid-state imaging apparatus are disposed on different substrates. Thereby, when the components of the A/D conversion circuit are sequentially arranged in the solid-state imaging apparatus according to a mode for carrying out the present invention, it is possible to shorten the wiring length of the signal affected by the number of phases of multi-phase clocks and reduce the wiring load of the signal line. Thereby, in the solid-state imaging apparatus according to a mode for carrying out the present invention, it is possible to reduce the drive capability of the circuit that outputs the signal to the signal line and reduce the circuit area or current consumption of the circuit. Thereby, it is possible to implement the size reduction or low power consumption of the solid-state imaging apparatus itself according to the mode for carrying out the present invention.

A specific configuration of a circuit in the present invention is not limited in the mode for carrying out the present invention, and various changes are possible in a range without departing from the scope and spirit of the present invention. For example, even when the component of the A/D conversion circuit is changed, the concept of the present invention can be similarly applied.

In addition, although the solid-state imaging apparatus in which the A/D conversion circuit is disposed in each column of the pixel unit has been described in this embodiment, the layout of the A/D conversion circuit of the solid-state imaging apparatus is not limited in the mode for carrying out the present invention. For example, a configuration in which one A/D conversion circuit is disposed for a plurality of columns of the pixel unit can be made.

In addition, although the case in which the pixel array unit has been formed only on the first substrate has been described in this embodiment, the pixel array unit formed in the solid-state imaging apparatus is not limited in the mode for carrying out the present invention. For example, even in the solid-state imaging apparatus in which the pixel array unit is divided and formed on the first substrate and the second substrate, the concept of the present invention can be similarly applied.

In addition, in the solid-state imaging apparatus according to the embodiment of the present invention, two substrates may be connected through a connector and three or more substrates may be connected through the connector. In the case of the solid-state imaging apparatus in which the three or more substrates are connected through the connector, two of the three or more substrates correspond to the first substrate and the second substrate according to the claims.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:
1. A solid-state imaging apparatus comprising:
a first substrate;
a second substrate electrically connected with the first substrate by a connector, the second substrate being bonded on the first substrate;
a pixel unit having pixels disposed in a two-dimensional matrix shape, each of the pixels including a photoelectrical conversion element which is disposed on the first substrate and is configured to generate a photoelectrical conversion signal according to an amount of incident light, the pixel unit being configured to output a photo- electrical conversion signal generated by each of the pixels from each row as a pixel signal; and analog-to-digital (A/D) converters, each of which is disposed on every one or more columns of the pixels provided in the pixel unit and is configured to generate a digital signal by digitizing a phase state of a multi-phase clock including clock signals of phases different from each other at predetermined fixed intervals corresponding to the pixel signal, wherein each of the A/D converters comprises first and second circuit sections whose circuit scales are determined according to the multi-phase clock, wherein the first circuit section is disposed on one of the first substrate and the second substrate, and wherein the second circuit section is disposed on the other one of the first substrate and the second substrate on which the first circuit section is not disposed.

2. The solid-state imaging apparatus according to claim 1, wherein each of the A/D converters comprises:

a comparison circuit configured to compare the input pixel signal to a reference signal which monotonically increases or decreases with the passage of time, and to output a comparison signal indicating that a relationship between the reference signal and the pixel signal satisfies a predetermined condition;

a latch unit having latch circuits configured to hold a phase state of the clock signal of a corresponding phase of the multi-phase clock at a timing at which the comparison signal is output; and a repeater unit having buffer circuits configured to compensate and drive a voltage of the clock signal of the corresponding phase of the multi-phase clock and to output the driven clock signal to the corresponding latch circuit, wherein the first circuit section comprises the latch unit, and wherein the second circuit section comprises the repeater unit.

3. The solid-state imaging apparatus according to claim 1, wherein each of the A/D converters comprises:

a comparison circuit configured to compare the input pixel signal to a reference signal that monotonically increases or decreases with the passage of time, and to output a comparison signal indicating that a relationship between the reference signal and the pixel signal satisfies a predetermined condition;

a latch unit having latch circuits configured to hold a phase state of the clocks signal of a corresponding phase of the multi-phase clock at a timing at which the comparison signal is output;

a signal driving circuit configured to drive an output signal of a predetermined latch circuit of the latch unit;

a lower-order digital signal generation unit configured to generate a lower-order side digital signal by digitizing the phase state of the multi-phase clock based on an output signal of each latch circuit of the latch unit; and a higher-order digital signal generation unit configured to generate a digitized higher-order side digital signal based on a signal of a predetermined bit of an output signal of a predetermined latch circuit driven by the signal driving circuit or the lower-order digital signal generated by the lower-order digital generation unit, wherein the first circuit section comprises the signal driving circuit, and wherein the second circuit section comprises the lower-order digital signal generation unit.

4. The solid-state imaging apparatus according to claim 3, wherein the signal driving circuit comprises a Schmitt trigger circuit, wherein the lower-order digital signal generation unit comprises:

an encoder configured to encode a phase state of the multi-phase clock based on an output signal of each latch circuit of the latch unit; and a lower-order counter configured to count the number of occurrences of a predetermined state of an output signal of the encoder, wherein the higher-order digital signal generation unit comprises:

a multiplexer configured to output one of an output signal of a predetermined latch circuit driven by the signal driving circuit and an output signal of a predetermined bit of the lower-order counter; and a higher-order counter configured to count the number of occurrences of a predetermined state of an output signal of the multiplexer, and wherein the second circuit section comprises at least one of the encoder and the lower-order counter as a circuit element.

5. The solid-state imaging apparatus according to claim 2, further comprising:

a reference signal generation circuit disposed on the second substrate and configured to generate the reference signal; and a clock generation circuit disposed on the second substrate and configured to generate the multi-phase clock at a timing at which the A/D converter starts A/D conversion.

6. The solid-state imaging apparatus according to claim 5, wherein the first circuit section is disposed on the first substrate, and wherein the second circuit section is disposed on the second substrate.

* * * * *